United States Patent [19]
Gavin et al.

[11] 4,058,881
[45] Nov. 22, 1977

[54] APPLICATION MACHINE FOR MOUNTING CIRCUIT BOARD PINS WITH AN IMPROVED CONTROL SYSTEM

[75] Inventors: John Henry Gavin, Lancaster; John Martin Spickler, Marietta, both of Pa.

[73] Assignee: E. I. Du Pont de Nemours and Company, Wilmington, Del.

[21] Appl. No.: 651,115

[22] Filed: Jan. 21, 1976

[51] Int. Cl.² .................................................. H05K 13/04
[52] U.S. Cl. ........................................ 29/715; 29/739; 29/593
[58] Field of Search ................... 29/203 B, 203 P, 626, 29/593

[56] References Cited
U.S. PATENT DOCUMENTS

| | | |
|---|---|---|
| 3,581,370 | 6/1971 | Passarella et al. .................. 29/203 B |
| 3,641,651 | 2/1972 | Rockwell, Jr. et al. ............ 29/203 B |
| 3,664,015 | 5/1972 | Bakermans ...................... 29/203 B X |
| 3,889,337 | 6/1975 | Shughart ............................ 29/203 B |
| 3,932,931 | 1/1976 | Wright .......................... 29/203 B X |
| 3,938,245 | 2/1976 | Lovendusky et al. ......... 29/203 B X |

*Primary Examiner* — Frank T. Yost

[57] ABSTRACT

An application machine for staking contacts, e.g. circuit board pins, in a hole in a circuit board including an extendable staking anvil mounted on a toggle linkage. The staking anvil is provided with a bore and a fluidic sensor in communication with the bore to detect the presence of a clear circuit board hole for insertion of a contact in the hole. In the event no hole is present, or a contact has already been staked in the hole, a control system responsive to the fluidic sensor retracts the extendable anvil and prevents staking a terminal pin in the circuit board where no hole is present, or where a pin has already been staked in the hole.

1 Claim, 4 Drawing Figures

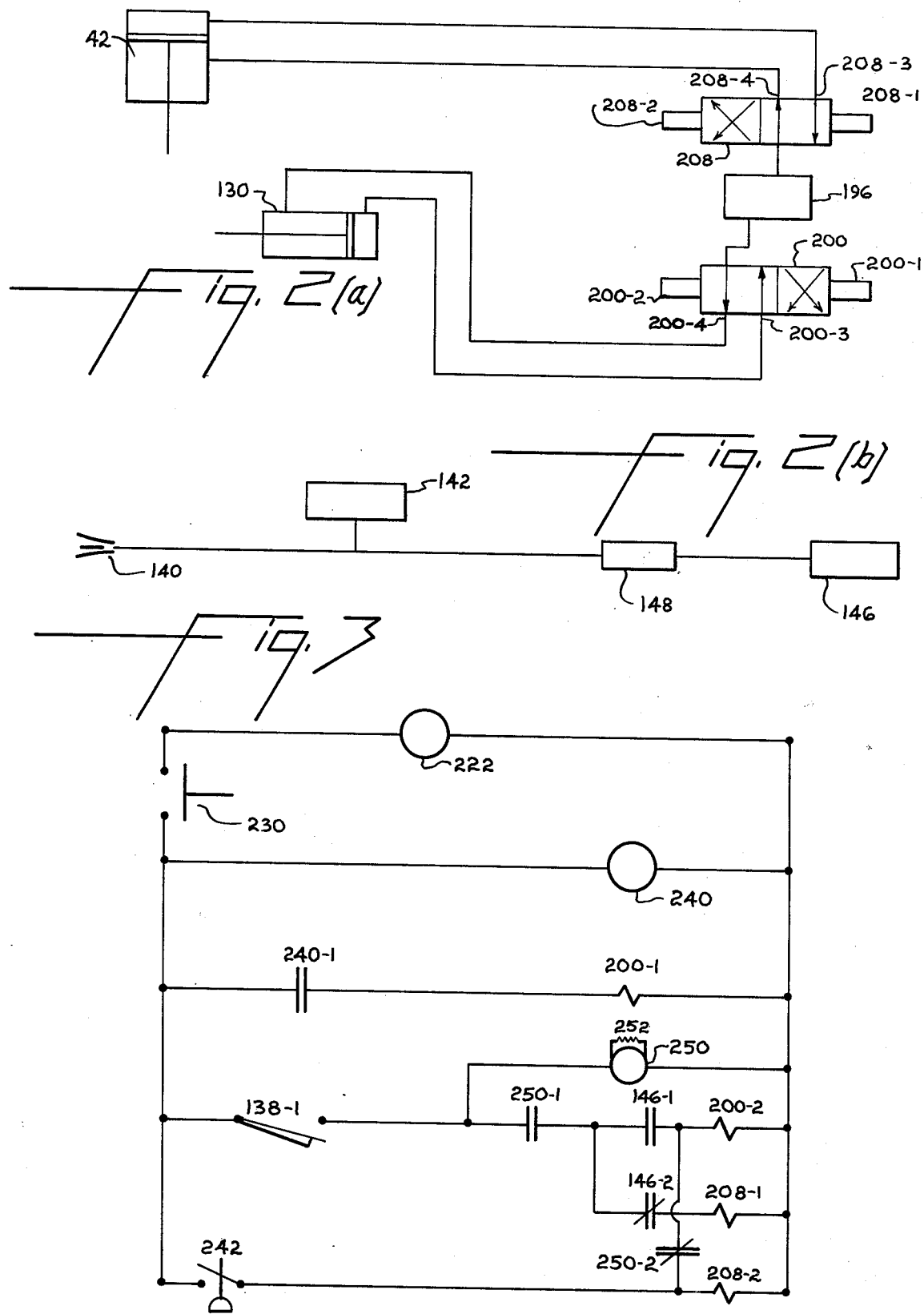

APPLICATION MACHINE FOR MOUNTING CIRCUIT BOARD PINS WITH AN IMPROVED CONTROL SYSTEM

BACKGROUND OF THE INVENTION

1. Field of the Invention

The present invention relates to an application machine for staking contacts, e.g. circuit board pins, in holes in a circuit board, and particularly relates to an improved control system for such an application machine.

2. Description of the Prior Art

An application machine for mounting wire wrap pins on circuit boards is described in U.S. Pat. No. 3,605,237. In the application machine described in this patent, a carrier strip on which circuit board pins are spaced at regular intervals is indexed to position the lead pin between a pair of clamps and in approximate axial alignment with a long, thin punch. A carrier strip feed track extends from a feed mechanism to one of the clamps. A pivoted portion of the feed track connects the thick portion of the track with a moveable clamp portion so the strip is moved as the clamp moves. After the pin has been positioned between the clamp, the punch lowers and the clamp closes to engage the pin and hold it in exact axial alignment with the punch. The punch then moves toward the pin to engage the pin and the clamps are opened to permit further movement of the punch to mount the pins in a hole in a circuit board positioned on a moveable support below the punch. A staking anvil mounted below the moveable support is extended in alignment with the punch to support the circuit board adjacent the hole in the circuit board during staking of the pin.

In the application machine described in this patent, the circuit board pin is accurately aligned relative to the punch, picked up by the punch, removed from the carrier strip and secured to the circuit board during a single downward stroke of the punch. Performing all these functions as the punch moves from the retracted to the fully extended position permits the applicator to attach pins to a circuit board at a high rate of speed. The operations of orienting, severing, releasing and staking the pins are all tied to the motion of the punch so that it is not possible for these steps to be performed out of sequence, and jamming is reduced. However, in the event the hole for receiving the contact in the circuit board is not properly aligned with the punch and anvil in the support, or in the event a contact has already been staked in the hole in the circuit board, the punch will attempt to stake another contact in a hole in which a contact is already present.

The improved control system of the present invention provides for insuring a hole in a circuit board is present and clear for receiving a circuit board pin.

An apparatus for direct insertion into a substrate of terminals from a flexible carrier strip is described in U.S. Pat. No. 3,837,063. In this apparatus, an anvil assembly cooperates with a sensor and an indicator to insure correct substrate orientation relative to a ram assembly. In this apparatus, ram activation is prevented unless an anvil finger is properly received in a terminal-receiving aperture.

A machine for successively positioning a workpiece such as a circuit board in predetermined relation to a tool such as an inserter according to a program dictated for instance by a template is described in U.S. Pat. No. 3,641,651. The machine includes a stylus in communication with a fluidic sensor, and the stylus is alignable with holes in a template so the fluidic sensor controls one or more component inserting heads.

The anvil assembly of the aforementioned patent uses a spring loaded mechanical finger mounted on a stationary staking anvil to prevent activation of a terminal-inserting ram unless a clear circuit board hole is present. Although this satisfactorily prevents staking a terminal where no hole is present, or double staking where a terminal has already been staked, such a mechanical finger is unsuitable where the application machine uses an extendable ram, e.g. such a mechanical finger can damage the circuit board or circuit board hole if minor misalignment occurs, or can dislodge a pin already staked when an anvil is extended to support the circuit board.

In the machine for positioning a circuit board of the latter mentioned patent, the stylus in communication with the fluidic sensor is alignable with holes in a template not with the contact inserting head or anvil. In this configuration, the sensor does not insure the actual hole in the circuit board is in proper alignment for receiving a contact, nor does it positively prevent double staking of a contact in a hole in a circuit board in which a contact has already been staked.

The improved control system of the present invention insures proper alignment of an extendable staking anvil with a hole for receiving a contact in a circuit board and positively prevents double staking of a contact in a hole in the circuit board in which a contact has already been staked.

SUMMARY OF THE INVENTION

According to the present invention, an application machine is provided for staking a contact in a hole in a circuit board comprising a base, a mounting plate extending from the base, a support mounted between the mounting plate and the base for receiving a circuit board and positioning a hole in the circuit board for receiving a contact, a punch assembly mounted on the mounting plate for staking a contact in the hole in the circuit board, an extendable anvil mounted on the base for supporting the circuit board during staking of a contact in the hole in the circuit board, the anvil including a bore in alignment with the punch assembly, a fludic sensor in communication with the bore in the extendable anvil for sensing the presence of a clear hole in the circuit board for receiving the circuit board contact before the punch stakes the contact in the hole in the circuit board, and means responsive to the fluidic sensor for preventing actuation of the punch when a clear hole in the circuit board is not in alignment with the bore in the extendable anvil.

The present invention including the fludic sensor in communication with the bore in the extendable anvil for supporting the circuit board is structurally distinguished from the mechanical sensors of the prior art and similar fludic sensors mounted on a stylus for alignment with holes in a template. The structure provides for positive sensing of a clear hole for receiving a circuit board contact.

BRIEF DESCRIPTION OF THE DRAWINGS

FIGS. 2(a) and (b) are pneumatic and fludic schematics embodying the improved control system of the present invention.

FIG. 3 is an electrical schematic diagram embodying the improved control system of the present invention.

Figure 1:
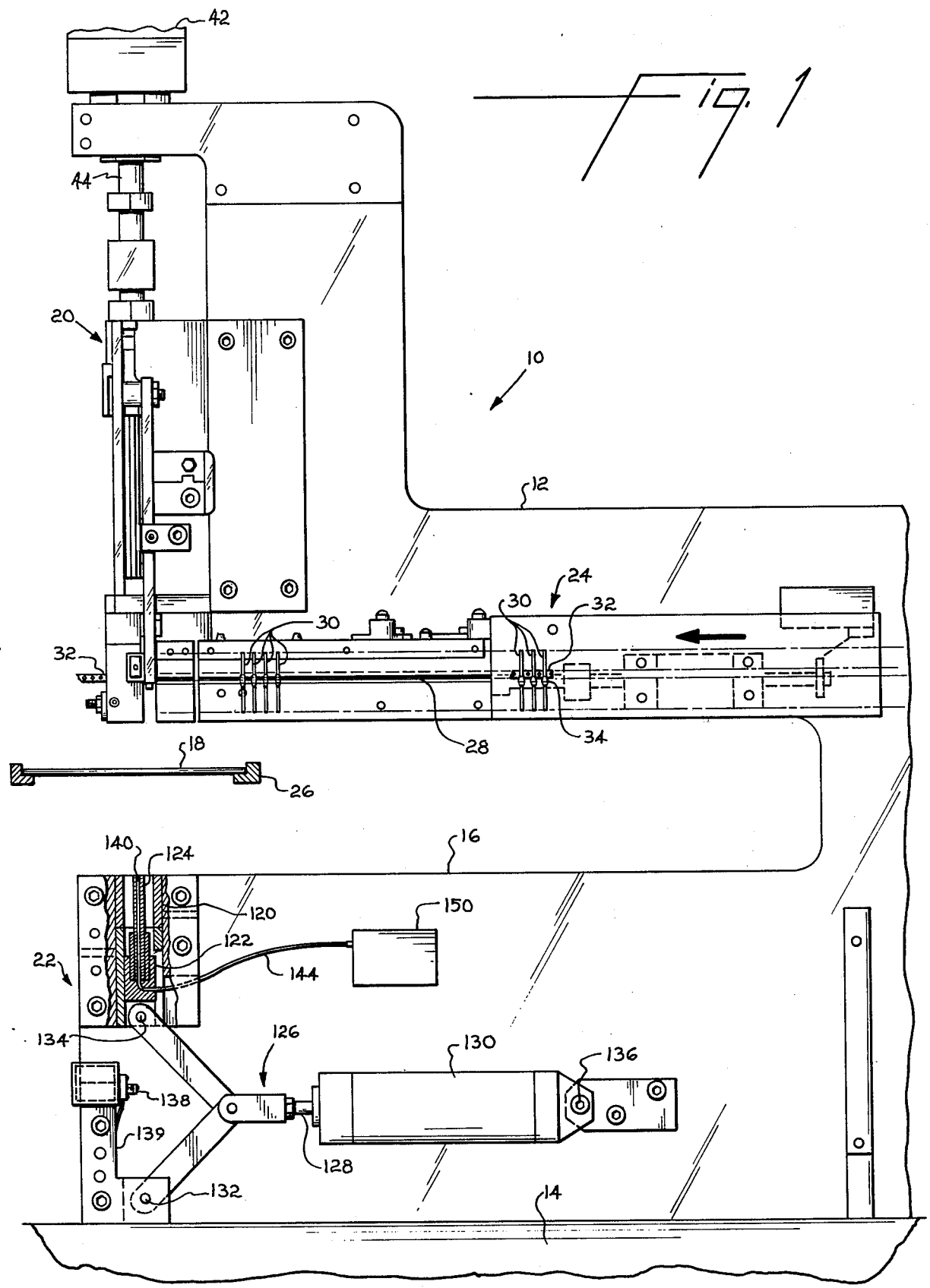
FIG. 1 is a side view of an embodiment of an application machine including the improved control system of the present application.

DESCRIPTION OF A PREFERRED EMBODIMENT OF THE INVENTION a preferred embodiment of an application machine including an improved control system according to the present invention is described below with reference to the attached drawings in which the same numerals are used throughout to identify the same elements.

A . application machine 10 includes a mounting plate 12 which extends upwardly from a base 14. A horizontally extending circuit board slot 16 is formed in one edge of the plate 12 to enable positioning of the circuit board between a punch assembly 20 and an anvil assembly 22. A suitable application machine is described in complete detail in U.S. Pat. No. 3,605,237, which is incorporated herein by reference.

An incremental pin feed 24 feeds the lead pin of a strip of pins to a cut-off position located within the punch assembly 20 so that upon actuation of the punch assembly 20 and anvil assembly 22, the pin is secured to the circuit board 18 in a hole in the board aligned between the two assemblies. Circuit board 18 is positioned within slot 16 on a moveable support 26.

A continuous strip 28 of square circuit board pins 30 are fed in the direction indicated in FIG. 1 along a feed track to the punch assembly 20. The pins 30 may be 0.025-inch square and may be plated to improve their conductive properties. A metal carrier strip 32 extends along the length of strip 28 and includes a number of regularly spaced pin-holding ferrules 34.

The punch assembly 20 is mounted on plate 12. Ram air cylinder 42 is mounted on plate 12 above the punch assembly 20. The piston rod 44 of air cylinder 42 is connected to the punch assembly 20.

Anvil assembly 22 is located on the plate 12 on the lower side of circuit board slot 16 beneath the punch assembly 20. Assembly 22 includes an anvil bearing 120 in which anvil support 122 is slidably confined to permit movement toward and away from the punch assembly 20. Anvil 124 is mounted on anvil support 122 so that when the support is extended, the upper end of the anvil 124 engages circuit board 18. Movement of the anvil 124 in bearing 120 is controlled by a toggle linkage 126 driven by a piston rod 128 of an air cylinder 130. The lower link of the toggle linkage 126 is pivoted at 132 to a support on plate 12, and the upper link of the assembly is pivoted at 134 to the bottom of anvil support 122. Air cylinder 130 is pivotally connected to plate 12 at 136. A limit switch 138 is mounted on block 139 and is engaged by the upper link of toggle linkage 126 when the air cylinder 130 fully extends the toggle linkage 126.

A central bore 140 extends through the anvil 124 and is in communication with a regulated air supply 142 through tube 144 and with fluidic pressure switch 146 through a resistor 148 mounted in box 150. A suitable fluidic pressure switch is a Model #4LC-010-000, manufactured by C. A. Norgren Company, Littleton, Colorado.

A simplified schematic diagram for the pneumatic control of the punch assembly 20 and anvil assembly 22 is illustrated in FIG. 2(a). A regulated air pressure supply 196 is connected to a double acting solenoid control valve 200. Solenoid control valve port 200-3 is connected to the extension side of anvil air cylinder 130 and valve port 200-4 is connected to the traction side of cylinder 130. Double-acting solenoid control valve 208 is connected to the regulated air supply 196 with control valve port 208-3 connected to the extension side of punch air cylinder 42 and valve port 208-4 connected to the retraction side of air cylinder 42.

A simplified schematic diagram for the electrical controls is illustrated in FIG. 3. A push and hold on-off push button 230 is connected in series with the control voltage 222. Relay coil 240 is connected in series with push button 230 across the control voltage 222. Relay contact 240-1, normally open, is connected in series with push button 230. Time delay relay coil 250 is connected in series with limit switch 138. Relay contact 250-1, normally open, is connected in parallel with the relay coil 250 and in series with form C contacts 146-1 and 146-2 of fluidic pressure switch 146. Resistor 252 in parallel with relay 250 determines the time delay of relay 250. Normally open form C contact 146-1 is connected in series with coil 200-2 of double acting solenoid valve 200. Normally closed form C contact 146-2 is connected in series with coil 208-1 of double acting solenoid valve 208. Relay contact 250-2, normally closed, is connected in series with relay contact 146-1, normally open, and coil 208-2 of double-acting solenoid valve 208. A stake pressure switch 242 is connected series with coil 208-2 of solenoid valve 208.

The operation of the improved control system embodiment of the present invention may be readily understood with reference to the attached drawings and the description which follows.

A circuit board 18 is positioned for receiving a pin 30 on the X-Y moveable support in slot 16 between anvil assembly 22 and punch assembly 20. Pushbutton 230 is closed by an operator and relay 240 is energized by control voltage 222. Normally open relay contact 240-1 is closed energizing coil 200-1 of solenoid control valve 200. Solenoid control valve 200 connects the regulated air supply 196 to the extension side of air cylinder 130. Piston rod 128 of air cylinder 130 is extended and extends toggle linkage 126. Toggle linkage 126 extends the anvil support 122 in anvil support bearing 120 until the upper end of anvil 124 engages the bottom surface of the circuit board 16. The upper link of toggle linkage 126 engages limit switch 138 and closes switch contact 138-1, which energizes the coil of time delay relay 250. Relay contact 250-1 is closed after a predetermined time interval sufficient to allow fluidic pressure switch 146 to sense whether the bore 140 in anvil 124 is in alignment with a clear circuit board hole for receiving the circuit board pin 30.

If a clear circuit board hole is in alignment with bore 140 in anvil 124 when relay contact 250-1 closes, the control voltage 222 energizes coil 208-1 of solenoid valve 208 through normally closed contact 146-2 of fluidic pressure switch 146. Solenoid control valve 208 connects the regulated air supply 196 to the extension side of air cylinder 42, and air cylinder 42 extends piston rod 44 actuating the punch assembly 20 to stake the pin 30 in a hole in the circuit board 18.

When the pin 30 is staked in the hole in the circuit board, the portion of the pin extending below the surface of the board into the bore 14 in the anvil creates an air back-pressure against the fluidic switch in communication with the bore 140 in anvil 124. The air back-pressure closes normally open contact 146-1 of fluidic switch 146 and energizes coil 200-2 of solenoid 200 to connect the retraction side of air cylinder 130 to the regulated air supply 196. The piston rod 128 of air cylinder 130 retracts the anvil 124. Stake pressure switch 242 is closed when the pin is staked in the board and energizes coil 208-2 of solenoid 208 to connect the retraction side of air cylinder 42 to the regulated air supply 196 and retracts the punch assembly 20.

If on extension of the anvil 124, the fluidic switch 146 in communication with bore 140 in the anvil senses an air back-pressure, caused by a misaligned hole or the presence of a pin in an aligned hole, normally open contact 146-1 is closed energizing coil 200-2 and 208-2 of solenoids 200 and 208, respectively. Solenoid 200 connects the retraction side of air cylinder 130 to the regulated air supply and retracts the anvil 124. Normally closed contact 142-2 is opened and prevents actuation of the punch assembly 20 by air cylinder 42 which is maintained in the retracted position by solenoid 208.

Although the improved control system embodying the present invention has been described and illustrated with reference to a circuit board pin inserting machine, wherein an operator manually locates a circuit board hole for receiving a circuit pin, it will be readily apparent that the improved control system of the present invention is equally useful with other application machines which use an extendable staking anvil, e.g. a pantograph machine having one or more staking heads or punches. A suitable pantograph machine using an extendable anvil is available from Berg Electronics, Division E. I. du Pont de Nemours and Company, New Cumberland, Pennsylvania under the Model #BP-150.

What is claimed is:

1. In an application machine for staking a contact in a hole in a circuit board comprising a base, a mounting plate extending from the base, a support mounted between the mounting plate and the base for receiving a circuit board and positioning a hole in the circuit board for receiving a contact, a punch assembly mounted on the mounting plate for staking a contact in the hole in the circuit board, an extendable anvil mounted on the base for supporting the circuit board during staking of a contact in the hole in the circuit board; said anvil including a bore in alignment with the punch assembly, the improvement comprising a fluidic sensor in communication with the bore in the extendable anvil for sensing the presence of a clear hole in the circuit board for receiving the circuit board contact before said punch stakes the contact in the hole in the circuit board, and control means responsive to the fluidic sensor for preventing actuation of said punch when a clear hole in the circuit board is not in alignment with the bore in said extendable anvil, said control means including a limit switch responsive to extension of said anvil and means to retract said extendable anvil and prevent actuation of said punch when a clear circuit board hole is not present for receiving a contact.

* * * * *